US010817107B2

(12) United States Patent
Abe

(10) Patent No.: US 10,817,107 B2
(45) Date of Patent: *Oct. 27, 2020

(54) DISPLAY UNIT

(71) Applicant: SONY CORPORATION, Tokyo (JP)

(72) Inventor: Hironobu Abe, Kanagawa (JP)

(73) Assignee: SONY CORPORATION, Tokyo (JP)

(*) Notice: Subject to any disclaimer, the term of this patent is extended or adjusted under 35 U.S.C. 154(b) by 0 days.

This patent is subject to a terminal disclaimer.

(21) Appl. No.: 16/291,111

(22) Filed: Mar. 4, 2019

(65) Prior Publication Data
US 2019/0196648 A1 Jun. 27, 2019

Related U.S. Application Data

(60) Continuation of application No. 15/912,875, filed on Mar. 6, 2018, now Pat. No. 10,254,887, which is a (Continued)

(30) Foreign Application Priority Data

Apr. 23, 2012 (JP) .................................. 2012-097625

(51) Int. Cl.
G09G 5/00 (2006.01)
G06F 3/041 (2006.01)
(Continued)

(52) U.S. Cl.
CPC .......... G06F 3/0416 (2013.01); G06F 1/1652 (2013.01); G06F 3/045 (2013.01);
(Continued)

(58) Field of Classification Search
CPC .. G06F 3/04886; G06F 1/1677; G06F 1/1616; G06F 1/1681; G06F 1/1618;
(Continued)

(56) References Cited

U.S. PATENT DOCUMENTS 7,456,826 B2    11/2008 Jurisch et al.
8,963,857 B2 *   2/2015 Kim ...................... G06F 3/0487
                                                345/173
(Continued)

FOREIGN PATENT DOCUMENTS

JP    53-245708 A    10/1988
JP    2000-207535 A   7/2000
(Continued)

OTHER PUBLICATIONS

Notice of Allowance and Fees Due for U.S. Appl. No. 15/912,875, dated Nov. 28, 2018, 08 pages.
(Continued)

Primary Examiner — Duc Q Dinh
(74) Attorney, Agent, or Firm — Chip Law Group

(57) ABSTRACT

A display unit has a flexible display section, a detection section for detecting a deflection amount and a deflection direction of the display section, a determination section for determining a visible portion and a non-visible portion of the display section based on the deflection amount and the deflection direction, and a control section for controlling display contents of the display section. The control section either prevents an image display on the non-visible portion or displays one of a fixed image or a pre-set moving image on the non-visible portion. The display unit also includes a displacement sensor located in the same region as the display section.

10 Claims, 8 Drawing Sheets

Related U.S. Application Data continuation of application No. 15/379,780, filed on Dec. 15, 2016, now Pat. No. 9,939,953, which is a division of application No. 13/850,464, filed on Mar. 26, 2013, now Pat. No. 9,626,938.

(51) Int. Cl.

| | | |
|---|---|---|
| *G09G 5/36* | (2006.01) | |
| *G06F 3/147* | (2006.01) | |
| *G06F 1/16* | (2006.01) | |
| *G06F 3/045* | (2006.01) | |
| *G09G 3/3208* | (2016.01) | |
| *H01L 27/32* | (2006.01) | |
| *H01L 51/00* | (2006.01) | |

(52) U.S. Cl.
CPC ............ *G06F 3/0412* (2013.01); *G06F 3/147* (2013.01); *G09G 3/3208* (2013.01); *G09G 5/363* (2013.01); *H01L 27/323* (2013.01); *G06F 2203/04102* (2013.01); *G09G 2330/021* (2013.01); *G09G 2354/00* (2013.01); *G09G 2380/02* (2013.01); *H01L 51/0097* (2013.01)

(58) Field of Classification Search
CPC .. G06F 2200/1614; G06F 3/044; G06F 3/017; G06F 3/04842; G06F 3/0488; G06F 3/0414; G06F 3/011; G06F 3/0304; G06F 3/045; G06F 21/74; G06F 2203/0339; G06F 2203/04106; G06F 3/0338; G09G 2354/00; G09G 2380/02; G09G 5/377; G09G 3/3208; G09G 5/14; G09G 2330/021; G09G 2320/0261; G09G 2320/0666; G09G 3/002; G09G 3/2003; G09G 5/00; G09G 5/003; G09G 5/363; G09G 2300/0426; G09G 2300/0465; G09G 2320/028; G09G 2320/08; G09G 2340/0492; G09G 3/20; G09G 5/37; G09G 5/38; H04N 9/3194; H04N 9/3147; H04N 13/363; H04N 21/47217; H04N 13/239
USPC ............................ 345/173–175, 1.1, 1.2, 1.3
See application file for complete search history.

(56) References Cited

U.S. PATENT DOCUMENTS

| | | | |
|---|---|---|---|
| 9,176,637 B2* | 11/2015 | Cohen | .................... G06F 3/048 |
| 2002/0094846 A1 | 7/2002 | Kishimoto et al. | |
| 2008/0291225 A1 | 11/2008 | Arneson | |
| 2008/0303782 A1* | 12/2008 | Grant | .................... G06F 1/1615 |
| | | | 345/156 |
| 2010/0011291 A1 | 1/2010 | Nurmi | |
| 2010/0117975 A1 | 5/2010 | Cho | |
| 2010/0321275 A1 | 12/2010 | Hinckley et al. | |
| 2011/0057873 A1 | 3/2011 | Geissler et al. | |
| 2011/0134145 A1* | 6/2011 | Moriwaki | ............ G09G 3/3208 |
| | | | 345/660 |
| 2011/0187681 A1 | 8/2011 | Kim et al. | |
| 2012/0092363 A1 | 4/2012 | Kim et al. | |
| 2012/0139834 A1 | 6/2012 | Han et al. | |
| 2013/0093660 A1 | 4/2013 | Hirsch et al. | |

FOREIGN PATENT DOCUMENTS

| | | | |
|---|---|---|---|
| JP | 2001-014513 A | 1/2001 | |
| JP | 2004-046792 A | 2/2004 | |
| JP | 2006-287481 A | 10/2006 | |
| JP | 2009-031737 A | 2/2009 | |
| JP | 2010-157060 A | 7/2010 | |
| JP | 2011-118245 A | 6/2011 | |
| JP | 2011-118303 A | 6/2011 | |

OTHER PUBLICATIONS

Non-Final Rejection for U.S. Appl. No. 15/912,875, dated May 3, 2018, 07 pages.
Office Action for CN Patent Application No. 201310131637.X, dated Mar. 25, 2016, 18 pages of Office Action and 09 pages of English Translation.
Office Action for JP Patent Application No. 2012-097625, dated Jul. 5, 2016, 05 pages.
Notice of Allowance for U.S. Appl. No. 15/379,780, dated Dec. 5, 2017, 10 pages.
Final Office Action for U.S. Appl. No. 15/379,780, dated Jul. 27, 2017, 11 pages.
Non-Final Office Action for U.S. Appl. No. 15/379,780, dated Jan. 27, 2017, 08 pages.
Notice of Allowance for U.S. Appl. No. 13/850,464, dated Dec. 7, 2016, 08 pages.
Non-Final Office Action for U.S. Appl. No. 13/850,464, dated Jun. 24, 2016, 15 pages.
Advisory Action for U.S. Appl. No. 13/850,464, dated Apr. 2, 2015, 02 pages.
Final Office Action for U.S. Appl. No. 13/850,464, dated Nov. 10, 2015, 16 pages.
Non-Final Office Action for U.S. Appl. No. 13/850,464, dated Jun. 3, 2015, 10 pages.
Final Office Action for U.S. Appl. No. 13/850,464, dated Jan. 27, 2015, 15 pages.
Non-Final Office Action for U.S. Appl. No. 13/850,464, dated Aug. 13, 2014, 10 pages.

\* cited by examiner

DISPLAY UNIT

CROSS REFERENCE TO RELATED APPLICATIONS

The present application is a continuation application of U.S. patent application Ser. No. 15/912,875, filed Mar. 6, 2018, which is a continuation application of U.S. patent application Ser. No. 15/379,780, filed Dec. 15, 2016, now U.S. Pat. No. 9,939,953, which is a divisional application of U.S. patent application Ser. No. 13/850,464, filed Mar. 26, 2013, now U.S. Pat. No. 9,626,938, which claims the priority from prior Japanese Priority Patent Application JP 2012-097625 filed in the Japan Patent Office on Apr. 23, 2012, the entire contents of which are hereby incorporated by reference.

BACKGROUND

The present disclosure relates to a display unit using a flexible substrate. In display units represented by liquid crystal display units, organic EL display units, electrophoretic display units, and the like, reduction in thickness and weight is desired. A glass substrate is often used in a device configuring known display units; however, since a glass substrate is heavy and susceptible to cracking, a certain thickness has been necessitated and thus reduction in thickness and weight has been limited.

Currently, flexible substrates such as plastic substrates are drawing attention as substrates that overcome the limitation of reduction in thickness and weight. Various display units have been disclosed as display units using a flexible substrate (flexible display unit). For example, it is proposed to utilize bending as a user interportion such that, when the whole display unit is deflected, a displayed image is decreased, enlarged, divided, or deformed, or the direction of the image is inverted (see, for example, Japanese Unexamined Patent Application Publication Nos. 2010-157060, 2011-118303, and 2011-118245).

SUMMARY

A flexible display unit is often used in a bent state, and when the device is bent, the rear portion of the device is not visually recognized. This is easily understood by imagining a person reading a folded newspaper on the train for example, and the person does not see the rear side of the folded newspaper. To see the rear side of the newspaper, the person turns over the whole newspaper. In other words, the portion of a display unit visually recognized by a user is often limited to only one of the portions of the display unit.

However, in the above-mentioned flexible display units disclosed in Japanese Unexamined Patent Application Publication Nos. 2010-157060, 2011-118303, and 2011-118245, an image similar to that of a visible portion is displayed also on a portion which is not visually recognized by the user. In other words, there has been an issue that the visible portion actually recognized by the user and the display portion (display section) may not necessarily correspond to each other.

It is desirable to provide a display unit that controls a display portion having flexibility so as to allow a display portion and a visible portion to correspond to each other.

A display unit according to an embodiment of the present technology includes: a display section having flexibility; a detection section that detects a deflection amount and a deflection direction of the display section; a determination section that determines a visible portion and a non-visible portion of the display section based on a result of the detection of the detection section; and a control section that controls display contents of the display section based on a result of the determination of the determination section.

In the display unit according to the above-described embodiment of the present technology, the determination section and the control section are included. The determination section determines the visible portion and the non-visible portion of the display section based on a result of the detection by the detection section that detects the deflection amount and the deflection direction of the display section. The control section controls display contents of the display section based on a result of the determination of the determination section. With this configuration, it is possible to control the display on the visible portion and the display on the non-visible portion of the display section having flexibility.

According to the display unit of the above-described embodiment of the present technology, the determination section and the control section are included, in which the determination section determines the visible portion and the non-visible portion of the display section, and the control section controls display contents of the display section based on the result of the determination of the determination section. This makes it possible to allow the visible portion actually visually recognized by the user and the display section of the display unit having flexibility to correspond to each other.

It is to be understood that both the foregoing general description and the following detailed description are exemplary, and are intended to provide further explanation of the technology as claimed.

BRIEF DESCRIPTION OF THE DRAWINGS

The accompanying drawings are included to provide a further understanding of the disclosure, and are incorporated in and constitute a part of this specification. The drawings illustrate embodiments and, together with the specification, serve to explain the principles of the technology.

DETAILED DESCRIPTION

With reference to the drawings, an embodiment of the present disclosure will be described in detail below. It is to be noted that description will be made in the following order.
1. Embodiment
1-1. Function of Display Unit
1-2. General Configuration of Display Unit
1-3. Method of Detecting Deflected Position and Deflection Amount of Display Unit
1-4. Functional Configuration of Display Unit
2. Modifications

1. Embodiment (1-1. Function of Display Unit)

Figure 1A:
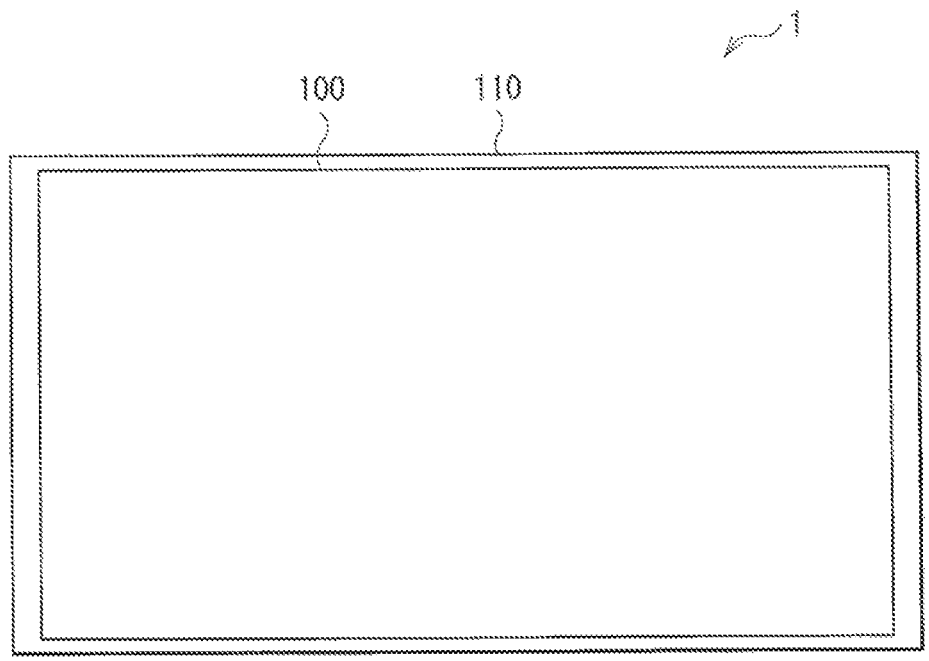
FIG. 1A is a view of a display unit according to an embodiment of the present disclosure in a horizontally disposed state.
Figure 1B:
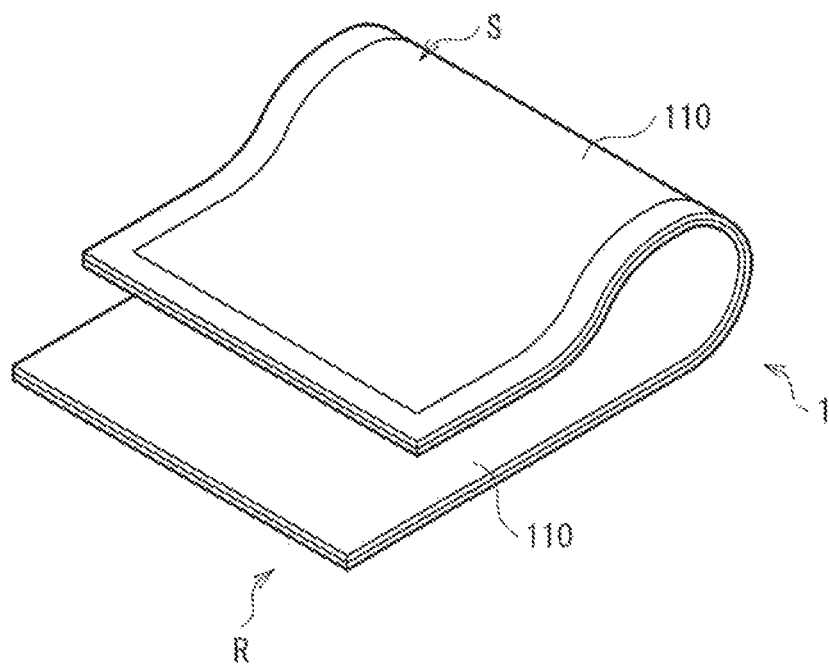
FIG. 1B is a view of the display unit in a curved state.

FIG. 1A schematically shows a display unit 1 according to an embodiment of the present disclosure in a horizontal state, and FIG. 1B schematically shows the display unit 1 in a curved state. The display unit 1 may be used as an electronic book having flexibility for example, and as illustrated in FIG. 1A for example, a display section 100 may be browsed not only in a planar state, but also in a deflected state or in a bent state as illustrated in FIG. 1B. A function of the display unit 1 according to the present embodiment will be described below.

Figure 2A:
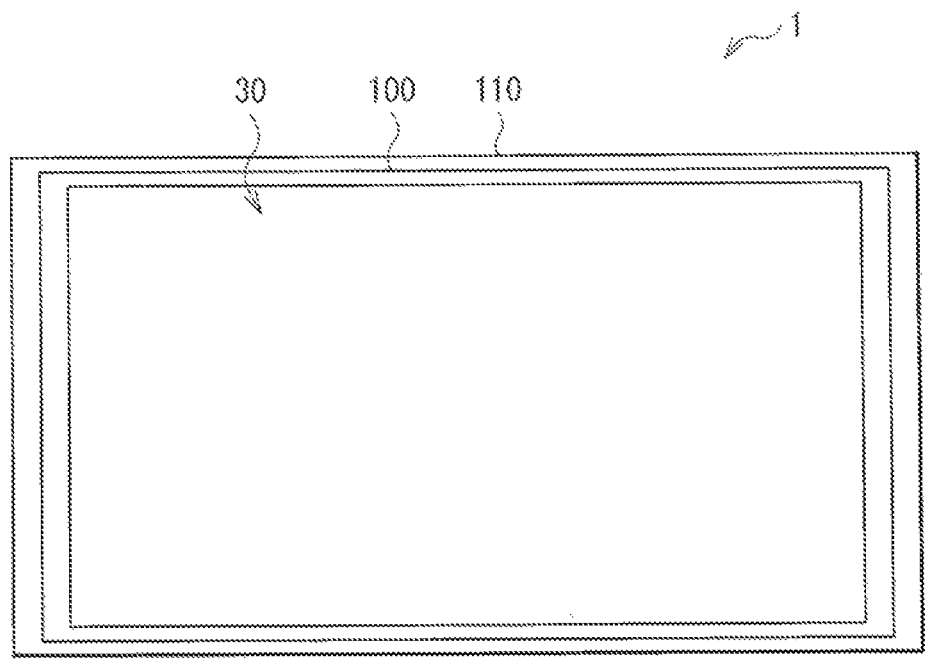
FIG. 2A is a plan view of the display unit illustrated in FIGS. 1A and 1B.
Figure 2B:
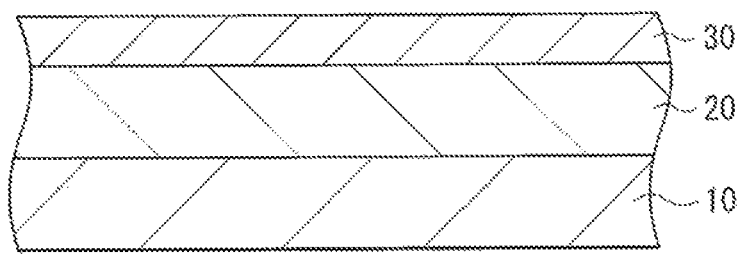
FIG. 2B is a sectional view thereof.

FIG. 2A shows a planar configuration of the display unit 1 according to the present embodiment, and FIG. 2B shows a cross-sectional configuration of the display unit 1. The display unit 1 includes the display section 100 in which a plurality of pixels each may be configured of an electronic circuit layer (not illustrated) described later may be disposed in a matrix. The display section 100 causes each pixel to emit light in response to a video signal, thereby displaying an image such as a still picture and a moving image. The display unit 1 is a flexible display unit having flexibility in whole, and a user may browse the display unit 1 not only in a planar state as illustrated in FIG. 1A, but also by deflecting or bending the whole display unit. As illustrated in FIG. 1B, when the display unit 1 is deflected or bent, the display section 100 includes a non-visible portion R which may not be visually recognized by the user, in addition to a visible portion S which may be visually recognized by the user.

The display unit 1 of the present embodiment detects a deflection amount of the display section 100 and distinguishes between the visible portion S and the non-visible portion R of the display section 100. The non-visible portion R may include, without limitation, one or more of functions described as follows. Examples of the function of the non-visible portion R may include, for example, a display-stop function to stop an image display on the non-visible portion R, a fixed-image display function to switch the image displayed on the non-visible portion R to a fixed image, and a so-called screen-saver function which may reduce the frequency of rewriting the image displayed on the non-visible portion R, may switch the image displayed on the non-visible portion R to a pre-set moving image, etc.

The display-stop function is a function to stop a display function so as not to perform the image display on the non-visible portion R as described above. The display-stop function may be implemented by stopping a display drive of pixels of the non-visible portion R, that is, by stopping the electricity supply to the corresponding pixels, or stopping the input of a display signal. For example, in a case of a liquid crystal display unit, a part of a backlight may be turned off, and in a case of an organic EL (electro luminescence) display unit, light emission may be partially stopped. When the image display on the non-visible portion R is stopped, unnecessary electricity consumption is suppressed.

Examples of the fixed-image display function may include switching of the non-visible portion R to a single-color display, for example. In particular, when a displayed color is set to black, the fixed-image display function may be realized by stopping the display drive similarly to the above-mentioned display-stop function. Further, when the fixed image is made to have the color which is the same as or similar to the color of a housing 110 of the display unit 1, it is possible to realize a product with great originality in which the fixed image and the housing 110 provide a sense of unity, for example.

The screen-saver function may be a function to, for example, switch images at a certain time interval similarly to the screen-saver function of a personal computer (PC) or the like.

In this manner, while an image which the user wishes to display is being displayed on the visible portion S, the non-visible portion R may be controlled to stop the image display per se, to display a fixed image, or to reduce the rewriting speed of the image, thereby allowing a display portion and the visible portion 5, which is actually visually recognized by the user of the display unit 1 to correspond to each other.

(1-2. General Configuration of Display Unit)

As illustrated in FIG. 2B, for example, the display unit 1 may have a configuration in which a first substrate 10 having flexibility and formed with display elements (light emitting elements) configuring the pixels, a second substrate 20 having flexibility similarly to the first substrate 10, and a displacement sensor 30 are laminated in this order. In the present embodiment, for example, the display portion may be disposed on the second substrate side, and the display unit 1 may be freely curved while an image is being displayed thereon.

As described above, the first substrate 10 may have a configuration in which the display elements configuring the pixels are formed on a substrate having flexibility, for example. The substrate is intended to support the display elements and may be made of a resin material, for example. Specific examples of the material of the substrate may include, without limitation, polyethylene terephthalate, polyethylene naphthalate, polyether sulfone, polyetherimide, polyetheretherketone, polyphenylene sulfide, polysulfone, polyarylate, polyimide, polyamide, polycarbonate, cellulose triacetate, polyolefin, polystyrene, polyethylene, polypropylene, polymethyl methacrylate, aramid, polyvinyl chloride, poly vinylidene chloride, an epoxy resin, a phenol resin, an urea resin, a melamine resin, a silicon resin, an acrylic resin, and the like. Such resin material may have a thickness of about 20 μm to about 200 μm both inclusive.

The display element may be made up of an electronic circuit layer and a display layer, for example. Specifically, the electronic circuit layer may be provided with elements such as a thin film transistor (TFT) including source-and-drain electrodes and semiconductor layers serving as a gate electrode, a gate insulating film, and a channel layer, for example. These components may be formed through processes such as a film formation by the CVD (chemical vapor deposition) method, etching, and a printing method. The display layer may include, for example but not limited to, a liquid crystal layer, an organic EL layer, or an electrophoretic layer interposed between a pixel electrode and a common electrode.

The second substrate 20 may have a function as a sealing substrate that seals the display elements provided on the first substrate 10. As the material of the second substrate 20, a material similar to that of the above-mentioned first substrate 10 may be used.

As illustrated in FIG. 2A, a transparent electrode body that detects the deflection amount and the visible portion of the display unit 1 is arranged on the surportion of the second substrate 20. The transparent electrode body may be the displacement sensor 30 (detection section) in one embodiment. Examples of the material of the displacement sensor 30 may include, for example, transparent electrode materials such as ITO (indium tin oxide), and IZO (indium zinc oxide). The displacement sensor 30 may be formed in the same region as the display section 100, for example.

The displacement sensor 30 may be the detection section that detects the deflection amount and the visible portion S of the display unit 1 as described above. Examples of the displacement sensor 30 that detects the deflection amount and the visible portion S may include, without limitation, a resistance sensor, a bend sensor, and an acceleration sensor, for example.

(1-3. Method of Detecting Deflected Position and Deflection Amount of Display Unit)

Figure 3A:
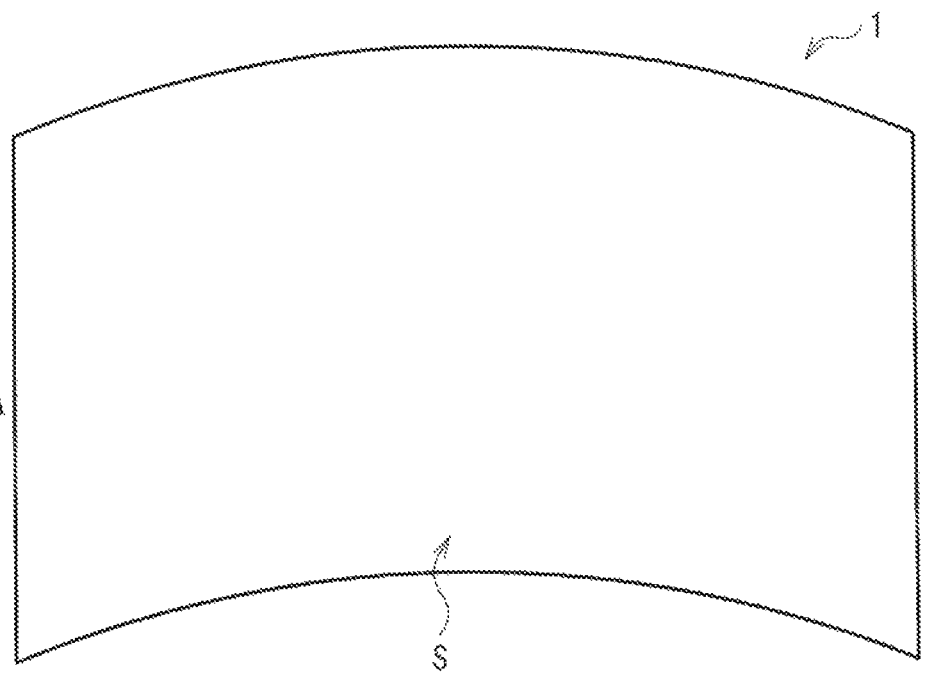
FIGS. 3A and 3B are each a schematic view of the display unit illustrated in FIGS. 1A and 1B.
Figure 3B:
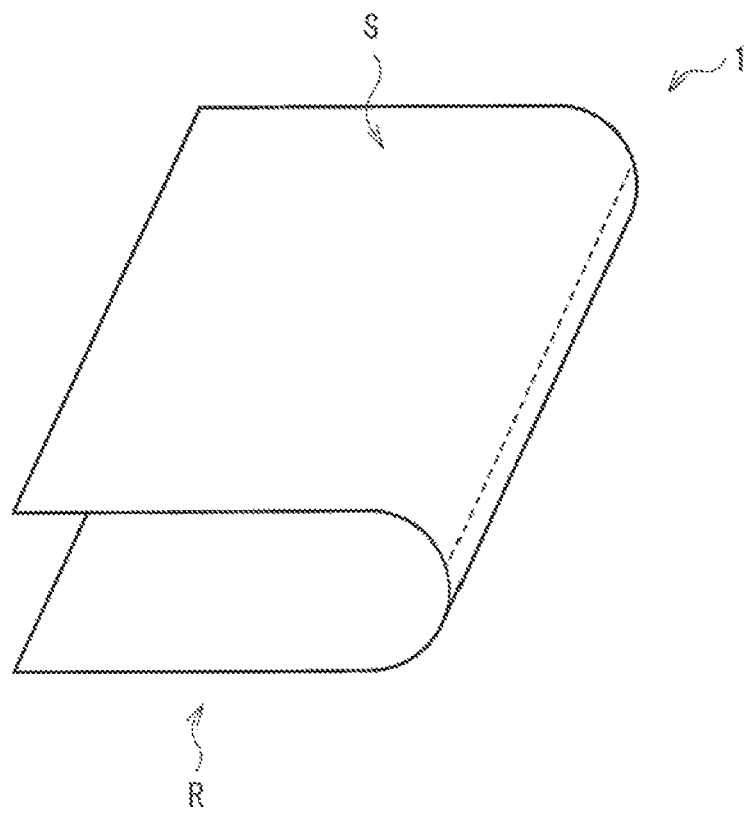

The display unit 1 having flexibility may be used in a state where entirety of the display section 100 serves as the visible portion S as illustrated in FIG. 3A, or in a state where a non-visible portion is formed at a part of the display section 100 as illustrated in FIG. 3B. In general, when a user visually recognizes the display unit 1, the display portion typically faces substantially upward with respect to gravity. In view of this, the normal display portion of the display unit 1 may be specified, as criteria, as corresponding to an upper direction substantially, and a deflection direction may be defined based on such specified criteria, for example. It should be noted that since the display portion with respect to gravity may be reversed when the display unit 1 is used by the user while he or she is lying down, setting of the display portion may be changed optionally by the user.

For example, definition such as "when the area of the visible portion S occupies two-thirds or less of the entire display section 100" may be used as a method or criteria to determine whether the display unit 1 is being deflected to such an extent that the visible portion S and the non-visible portion R can be distinguished from each other as illustrated in FIG. 3B, for example. The set value for the area corresponding to the two-thirds (not necessarily limited to two-thirds) of the entire display section 100 may be previously stored in a storage section 122 of the display unit 1 as a data table, for example. It is to be noted that this set value may be reset by the user freely.

Further, a curved position dividing the display section 100 into the visible portion S and the non-visible portion R may be detected with use of a sensor described below as the displacement sensor 30, for example. As such displacement sensor 30, a resistance sensor employed as a touch sensor in an existing touch panel may be adopted, for example. The displacement sensor 30 (resistance sensor) may have a configuration in which two metal thin films (resistance films), each configured of a transparent electrode made of a material such as ITO and IZO, are oppositely disposed (disposed to portion each other), and a plurality of the pair of such metal thin films are disposed in a matrix in a plane region, for example. The transparent electrodes facing each other disposed in the displacement sensor 30 have resistance. A predetermined voltage is applied to one of the electrodes and the resistance value between the electrodes is monitored. In this configuration, when the display unit 1 is curved, the resistance value between the metal thin films is varied at the curved position, and a voltage corresponding to the curvature is generated at the other electrode, and thus the variation in resistance value is detected. Accordingly, by detecting the metal thin film exhibiting a variation in resistance value from among the pairs of the metal thin films disposed in a matrix, it is possible to detect the position of the variation in the displacement sensor 30 and thus to detect the bent position in the display section 100. In this manner, the display unit 1 may detect the amount of the variation in resistance detected by the displacement sensor 30, thereby detecting the curved position and the deflection amount of the display unit 1.

(1-4. Functional Configuration of Display Unit)

Figure 4:
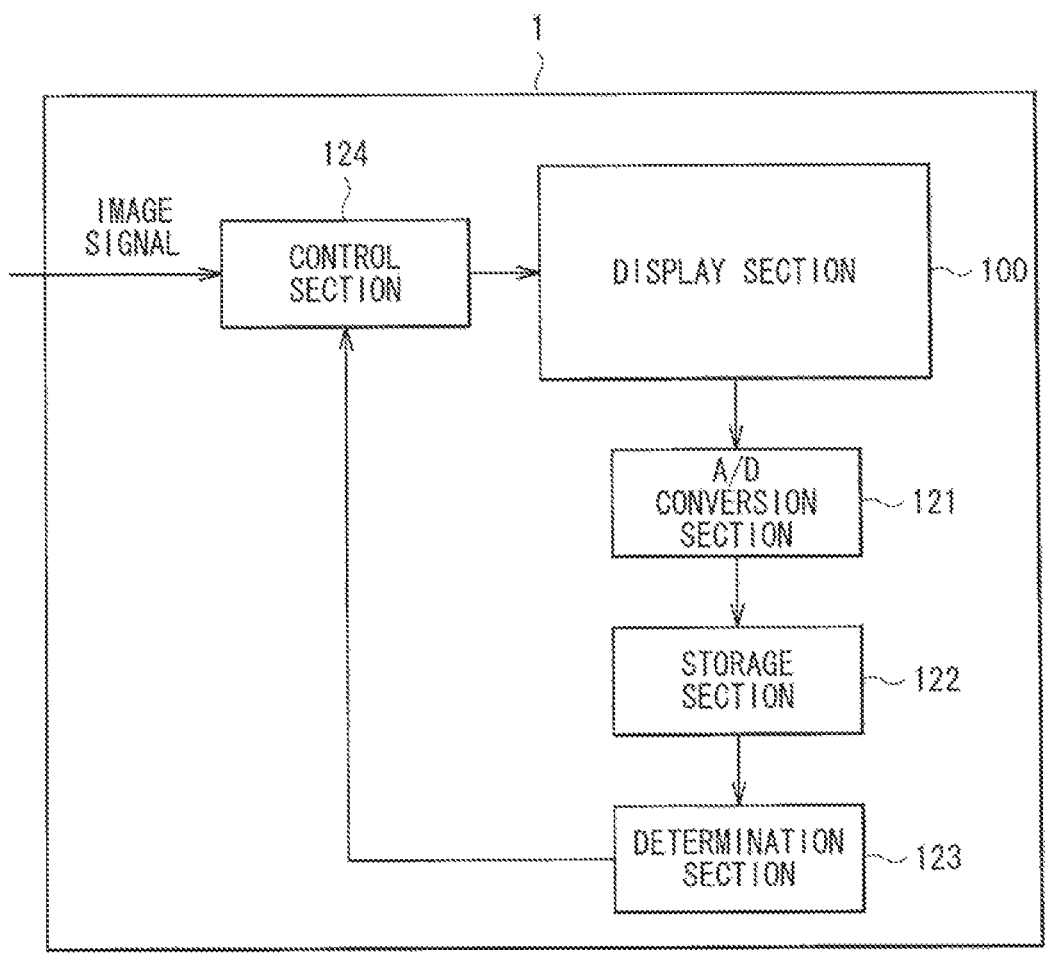
FIG. 4 is a block diagram of the display unit illustrated in FIGS. 1A and 1B.

Now, an example of a method of controlling the display unit 1 is described in detail. FIG. 4 is a block diagram illustrating a functional configuration of the display unit 1 according to the present embodiment.

As illustrated in FIG. 4, the display unit 1 may include the display section 100, an A/D conversion section 121, the storage section 122, a determination section 123, and a control section 124, for example. The display section 100 may have a lamination structure including the first substrate 10, the second substrate 20, and the displacement sensor 30 as illustrated in FIGS. 2A and 2B. The A/D conversion section 121 converts a deflection amount of the display section 100, which may be detected by the displacement sensor 30 as an analog value, into a digital value, for example. The storage section 122 stores a value set by the user, and temporarily stores the deflection amount of the display section 100 converted by the A/D conversion section 121 to the digital value. The determination section 123 may use the set value and the deflection amount of the display section 100 stored in the storage section 122 to determine whether the display section 100 has the non-visible portion R. The control section 124 executes various kinds of controls on the non-visible portion R of the display section 100 based on the determination of the determination section 123.

In the present embodiment, when the user bends the display unit 1 as illustrated in FIG. 3B, the displacement sensor 30 provided in the display unit 1 may detect a voltage generated at the position where the user has operated the display section 100, for example. The displacement sensor 30 may output this voltage to the A/D conversion section 121 as an analog value.

Figure 5:
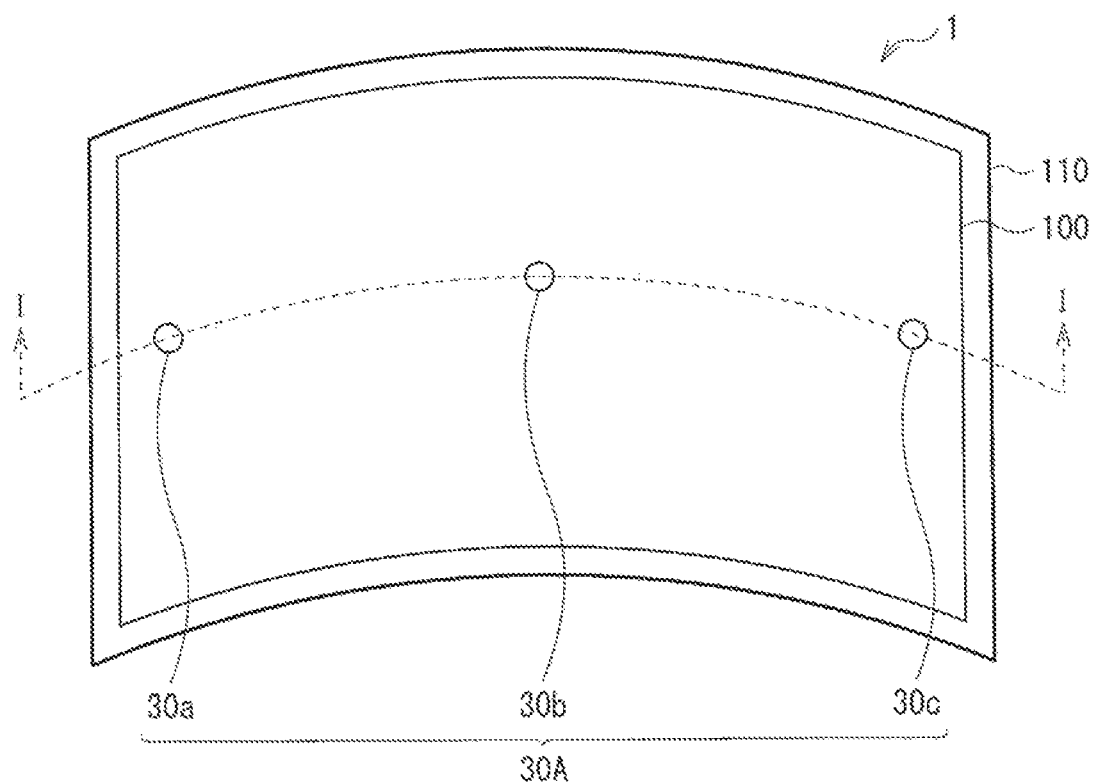
FIG. 5 is a view showing a configuration of the display unit illustrated in FIGS. 1A and 1B.
Figure 6:
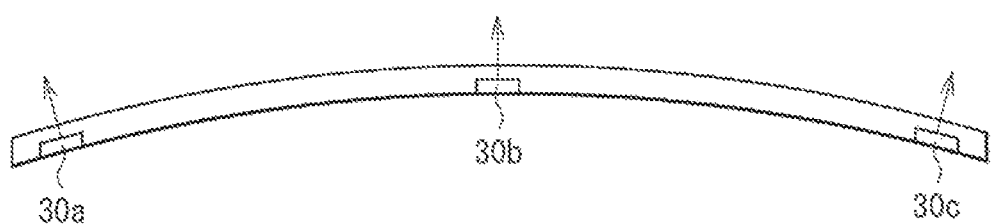
FIG. 6 is a schematic view for describing a substantially horizontal state of the display unit illustrated in FIGS. 1A and 1B.
Figure 7:
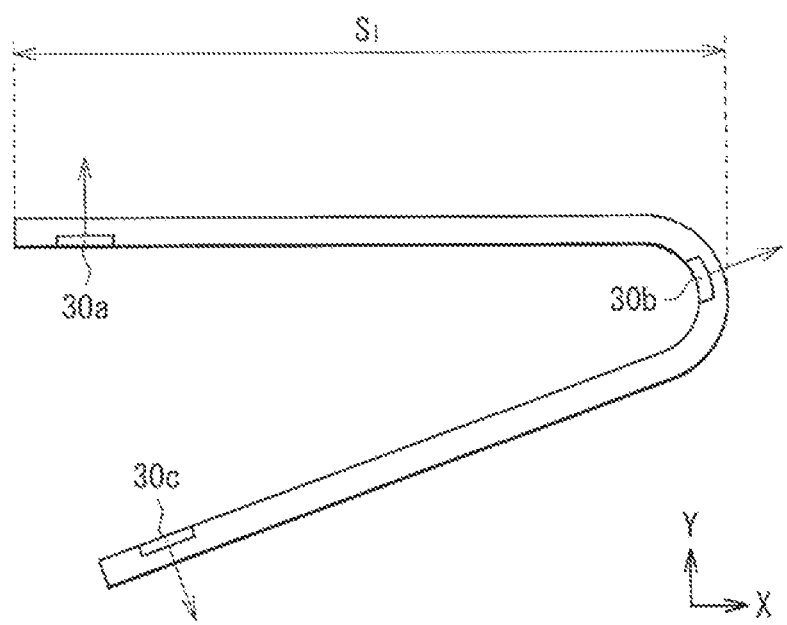
FIG. 7 is a schematic view for describing a curved state of the display unit illustrated in FIGS. 1A and 1B.

It is to be noted that, in this instance, an exemplary case is described in which an acceleration sensor 30A is used as the displacement sensor 30. The displacement sensor 30 is not limited to an example, such as the example of the resistance sensor mentioned above, in which the displacement sensor 30 is disposed in a matrix all over the plane region. For example, as illustrated in FIG. 5, the acceleration sensor 30A may be disposed at three locations (not necessarily limited to three) on an X-axis on the rear side of the display section 100, for example, at both end portions and a center portion of the display section 100. The acceleration sensor 30A may be provided on the rear side of the display unit 1, in other words, on the first substrate 10 side. FIG. 6 shows a cross-sectional configuration taken along a line I-I of the display unit 1 illustrated in FIG. 5. In this display unit 1, the direction of the display portion with respect to gravity may be obtained from each of the acceleration sensors 30A disposed at the three locations. In the case where the substantially upper portion direction with respect to gravity is set as a normal visible portion S and the display unit 1 is significantly deflected as illustrated in FIG. 7, directions of the planes at respective positions of the display section 100 may be detected as facing in an upper direction (+Y direction) by the sensor at the left end (the acceleration sensor 30a), as facing in an right-upper direction (+X+Y direction) by the sensor at the center (acceleration sensor 30b), and as facing a right-lower direction (+X−Y direction) by the sensor at the right end (acceleration sensor 30c), for example. Further, the distances between the sensors (the acceleration sensors a to c) may be calculated to allow the control section 124 to recognize a projection area S1 as seen from above as the visible portion S, as illustrated in FIG. 7.

It is to be noted that while in the configuration illustrated in FIG. 4 the storage section 122 temporarily stores the deflection amount of the display section 100 converted to the digital value by the A/D conversion section 121, this is illustrative and not limitative. For example, the deflection amount of the display section 100 converted to the digital value by the A/D conversion section 121 may be directly outputted to the determination section 123.

The deflection amount converted to the digital value by the A/D conversion section 121 may be transmitted to the storage section 122, and further, may be sent to the determination section 123 together with the value previously set by the user. The determination section 123 may determine the deflection amount of the display unit 1 with use of the value set by the user as a threshold value. For example, when the deflection amount detected by the displacement sensor 30 (the acceleration sensor 30A) is greater than the threshold value, the determination section 123 distinguishes between the visible portion S and the non-visible portion R of the display section 100, and outputs a display switching signal for the non-visible portion R to the control section 124. The control section 124 may be made up of hardware such as a sensor and a circuit, or the central processing unit (CPU), and software (program) that makes the hardware or the CPU work, for example. The control section 124 uses the display switching signal sent from the determination section 123 to control the display on the non-visible portion R of the display section 100 of the display unit 1. In other words, the display on the non-visible portion R of the display section 100 may be stopped or switched to a fixed image or a screen-saver image as mentioned above.

As described above, a so-called flexible display unit having flexibility is often used in a bent state, and when the device is bent, the rear portion of the device is not visually recognized. However, although an existing flexible display unit is provided with functions for decreasing, enlarging, and dividing a displayed image in response to deflection of the whole display unit, the portion visually recognized by the user (visible portion) and the portion (display portion) on which the image is being displayed may not necessarily correspond to each other. As a result, the rear portion of the device in the bent state, that is, the portion not visually recognized by the user, is exposed to the other people than the user, which may lead to invasion of privacy. Further, as a result, devices that consume electricity by performing display, such as liquid crystal devices and organic EL devices, consume unnecessary electricity by performing display on the non-visible portion.

In contrast, in the display unit 1 according to the present embodiment, the deflection amount and deflection direction of the display section 100 are detected, and, based on the detection result, the visible portion S and the non-visible portion R of the display section 100 are determined, thereby switching the display contents of the non-visible portion R. Thus, it is possible to control the display on the non-visible portion R of the display unit 1 having flexibility.

As described above, the display unit 1 according to the present embodiment determines the visible portion S and the non-visible portion R for the user of the display section 100, and, based on this determination result, controls the display contents of the non-visible portion R. This makes it possible to allow the display portion and the visible portion S visually recognized by the user of the display unit 1 to correspond to each other.

Consequently, it is possible to stop the screen display from being exposed to the other people than the user, and thus to protect the user's privacy. Further, it is possible to stop or reduce the power consumption of the non-visible portion R when the display contents of the non-visible portion R is controlled to perform a function such as stopping the image display, displaying the fixed image, and using the screen-saver function, for example. In other words, it is possible to suppress the electricity consumption of the whole display unit 1.

Next, modifications of the display unit 1 according to the above-mentioned embodiment will be described. While a sensor such as the resistance sensor and the acceleration sensor 30A is employed in the displacement sensor 30 in the above-mentioned embodiment, this is illustrative and not limitative, and various kinds of sensors may be employed. Note that the same or equivalent elements as those of the display unit 1 according to the example embodiment described above are denoted with the same reference numerals, and will not be described in detail.

2. Modifications (Modification 1)

Figure 8A:
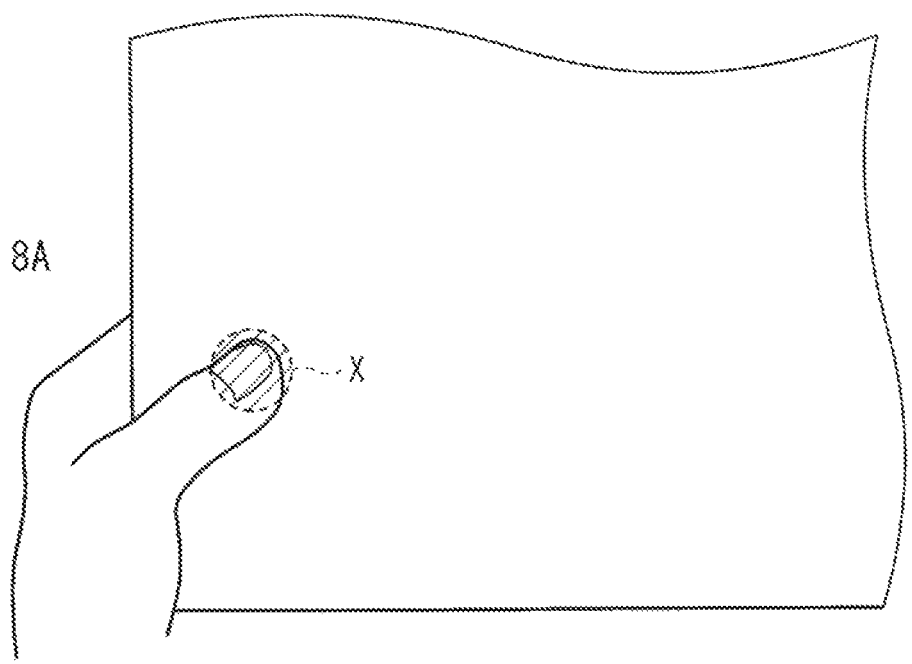
FIG. 8A is a schematic view showing a front portion of a display unit according to a modification 1.

A display unit 2 according to a modification 1 employs a pressure sensor 30B as the displacement sensor 30 of the above-mentioned embodiment. In the display unit 2 having flexibility, given that the user typically uses the device by hand, the user visually recognizes the portion on the thumb side as illustrated in FIG. 8A. In view of this, by making the display unit 2 recognize how the user is holding the device, it is possible to detect which portion of the display section 100 is being visually recognized by the user, and further to accurately compute the area of the visible portion.

Figure 8B:
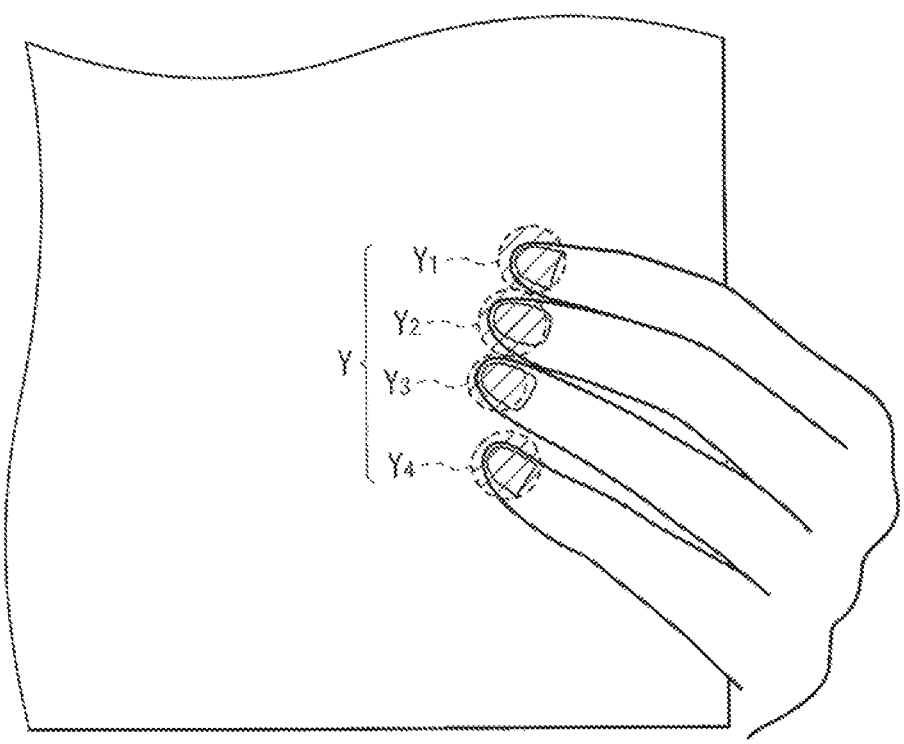
FIG. 8B is a schematic view showing a rear portion thereof.

For example, in order to detect the position of the user's hand on the display unit 2, the thumb side and the other side than the thumb side may be discriminated from each other at first. This discrimination may be performed based on the contact area of hand (fingers) on the display unit 2. As illustrated in FIGS. 8A and 8B, the total contact area (Y) of fingers other than the thumb (shaded areas Y1 to Y4) is larger than the contact area of the thumb (shaded area X). Although there is an exceptional case where the display unit is held by one finger on each portion, for example, by the thumb and the index finger, plural fingers are naturally placed on the device when the display unit is viewed for a certain amount of times. For this reason, normally, the contact area X of the thumb may be assumed to be smaller than the total contact area Y of the fingers other than the thumb. Further, other than the contact area, the discrimination may be performed based on the number of contacts. For example, the discrimination may be performed based on whether the spot contacted by thumb (one spot) is less than the spots contacted by fingers other than the thumb (two to four spots).

The present modification is different from the above-mentioned embodiment in that the visible portion S and the non-visible portion R of the display section 100 are discriminated from each other based on the contact area or the number of contacts by hand (fingers) described above, and that the contact area or the number of contacts is detected as pressure spot by the pressure sensor 30B.
(Modification 2)

A display unit 3 according to a modification 2 discriminates between the visible portion S and the non-visible portion R of the display section 100 based on the contact area or the number of contacts by hand (fingers) described above similarly to the case of the above-mentioned modification 1. In the present modification 2, a temperature sensor 30C is employed as the displacement sensor 30, and the contact area or the number of contacts by fingers is detected as heat spot.
(Modification 3)

A display unit 4 according to a modification 3 discriminates between the visible portion S and the non-visible portion R of the display section 100 based on the contact area or the number of contacts by hand (fingers) described above similarly to the case of the above-mentioned modifications 1 and 2. In the modification 3, a photosensor 30D is employed as the displacement sensor 30. In the display section 100 of the display unit 4, external light struck on the display unit 4 is shielded by the hand (fingers) holding the display unit 4, and the quantity of light is thus varied. The discrimination between the visible portion S and the non-visible portion R is performed by taking the variation in the quantity of light as the contact area of the finger.

Each of the display units 1 to 4 mentioned above may be installed in an electronic apparatus of an application example described below, for example.

Application Example

Figure 9A:
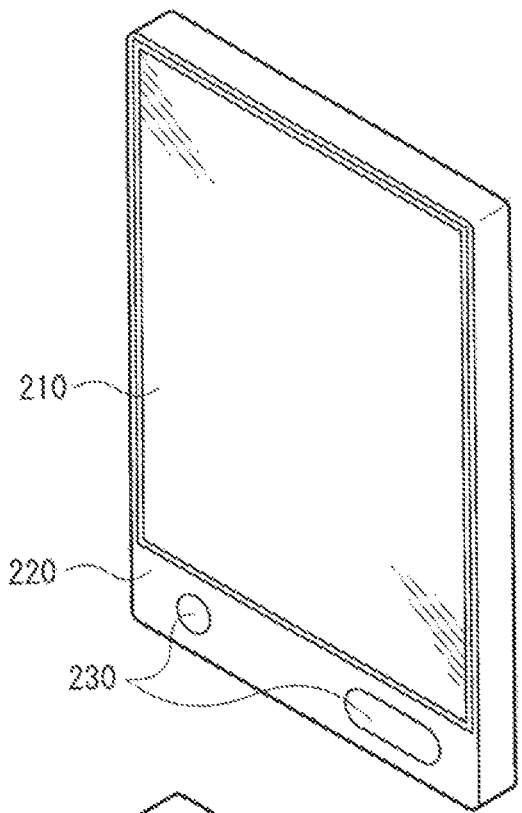
FIG. 9A is a perspective view showing an external appearance of an application example as viewed from a front side.
Figure 9B:
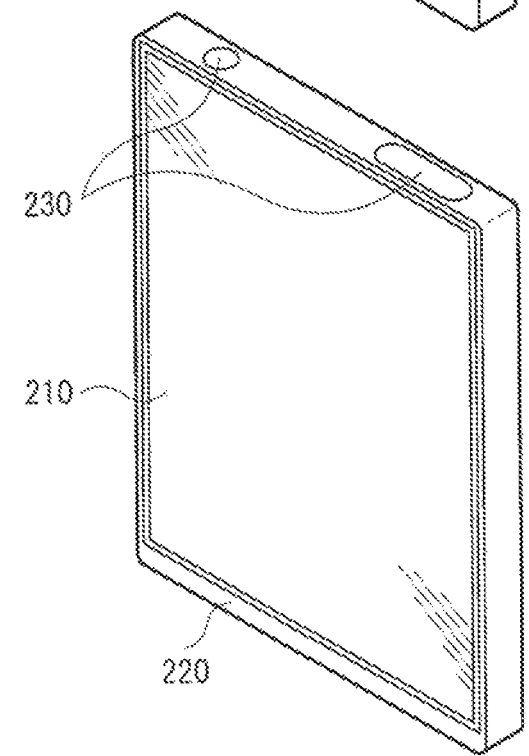
FIG. 9B is a perspective view showing an external appearance thereof as viewed from a rear side.

FIGS. 9A and 9B each show an external appearance of an electronic book. This electronic book may include a display section 210, a non-display section 220, and an operation section 230, for example. It is to be noted that the operation section 230 may be provided on a front portion of the non-display section 220 (housing) as illustrated in FIG. 9A, or may be provided on a top portion thereof as illustrated in FIG. 9B. It is to be noted that each of the display units 1 to 4 may also be installed in any device, such as a FDA, having a configuration similar to that of the electronic book illustrated in FIGS. 9A and 9B.

Likewise, each of the display units 1 to 4 mentioned above may also be employed in electronic apparatuses such as various kinds of mobile devices (including, without limitation, a note-type PC, a mobile audio player, a mobile phone, a smartphone, and a FDA (personal digital assistant)). Further, each of the display units 1 to 4 may be employed not only in a book reader, but also in any display unit and any electronic apparatus in which a function such as a music player, a movie player, a picture viewer, a map application, and a web browser can be used.

Further, each of the display units 1 to 4 may be applied to any device which is very close to paper and allows for arbitrary bending, such as an electronic-newspaper terminal device. Each of the display units 1 to 4 may also be applied to a device for use in presentation of menu in shops, a digital signage (advertising apparatus), etc.

Hereinabove, while the present disclosure has been described with reference to the example embodiment, the modifications, and the application examples, the present disclosure is not limited to the above-mentioned example embodiment, the modifications, and the application examples, and various modifications may be made. For example, while the planer shape of the display unit 1 is a rectangular shape in the above-mentioned example embodiment, the modifications, and the application examples, the planer shape of the display unit 1 is not limited thereto, and any other forms such as a square shape, other polygonal shapes, a circular shape, and an ellipse shape may also be adopted.

Further, the materials and the thicknesses of the layers described in the above-mentioned example embodiment, the modifications, and the application examples are illustrative and not limitative, and other materials and thicknesses may also be adopted.

Further, while the configuration of the display unit 1 has been described with reference to the specific examples in the above-mentioned example embodiment, the modifications, and the application examples, it is not necessary to include all of the components, and other components may also be included. For example, a layer such as a protective layer and an optical film may be provided between the first substrate 10 and the second substrate 20. Further, a barrier layer may be provided between the substrate and the electronic circuit layer. When the barrier layer is provided, it is possible to prevent the electronic circuit layer and the display layer from being degraded by moisture or organic gas.

Furthermore, in order to perform color display, a color filter layer, or a flexible substrate provided with a color filter and an adhesive layer fixing the flexible substrate may be provided above the display layer of the display element.

Furthermore, the technology encompasses any possible combination of some or all of the various embodiments, the modifications, and the application examples described herein and incorporated herein.

Accordingly, it is possible to achieve at least the following configurations from the above-described example embodiments, the modifications, and the application examples of the disclosure.

A display unit has a display section having flexibility; a detection section configured to detect a deflection amount and a deflection direction of the display section; a determination section configured to determine a visible portion and a non-visible portion of the display section based on the deflection amount and the deflection direction; and a control section configured to control display contents of the display section. The display contents may be display contents of the non-visible portion. Also, the control section either prevents an image display on the non-visible portion or displays one of a fixed image or a pre-set moving image on the non-visible portion. The display unit further includes an A/D conversion section configured to convert the deflection amount into a digital value and a storage section configured to store a set value and the digital value. Additionally, the display unit further comprises a displacement sensor located in the same region as the display section. In one embodiment, the displacement sensor may be a resistance sensor configured to detect a position of a curve that divides the display section into the visible portion and the non-visible portion. In another embodiment, the displacement sensor includes at least three acceleration sensors respectively disposed at both end locations and a center location on an X-axis on a rear side of the display section. In yet another embodiment, the displacement sensor comprises at least one of a photosensor, a temperature sensor, and a pressure sensor.

Accordingly, it is possible to achieve at least the following configurations from the above-described example embodiments, the modifications, and the application examples of the disclosure.

(1) A display unit comprising:
a display section having flexibility;
a detection section configured to detect a deflection amount and a deflection direction of the display section;

a determination section configured to determine a visible portion and a non-visible portion of the display section based on the deflection amount and the deflection direction; and a control section configured to control display contents of the display section.

(2) The display unit according to (1), wherein the display contents comprise display contents of the non-visible portion.

(3) The display unit according to (2), wherein the control section is configured to prevent an image display on the non-visible portion.

(4) The display unit according to (1), wherein the control section is configured to display one of a fixed image or a pre-set moving image on the non-visible portion.

(5) The display unit according to (1), further comprising an A/D conversion section configured to convert the deflection amount into a digital value, and a storage section configured to store a set value and the digital value.

(6) The display unit according to (1), further comprising a displacement sensor located in the same region as the display section.

(7) The display unit according to (6), wherein the displacement sensor comprises a resistance sensor configured to detect a position of a curve that divides the display section into the visible portion and the non-visible portion.

(8) The display unit according to (6), wherein the displacement sensor comprises at least three acceleration sensors respectively disposed at both end locations and a center location on an X-axis on a rear side of the display section.

(9) The display unit according to (6), wherein the displacement sensor comprises at least one of a photosensor, a temperature sensor, and a pressure sensor.

(10) An electronic device including a display unit comprising:
a display section having flexibility;
a detection section configured to detect a deflection amount and a deflection direction of the display section;
a determination section configured to determine a visible portion and a non-visible portion of the display section based on the deflection amount and the deflection direction; and
a control section configured to control display contents of the display section.

(11) The display unit according to (10), wherein the display contents comprise display contents of the non-visible portion.

(12) The electronic device according to (10), further comprising a displacement sensor located in the same region as the display section.

(13) The electronic device according to (12), wherein the displacement sensor comprises a resistance sensor configured to detect a position of a curve that divides the display section into the visible portion and the non-visible portion.

(14) The electronic device according to (12), wherein the displacement sensor comprises at least three acceleration sensors respectively disposed at both end locations and a center location on an X-axis on a rear side of the display section.

(15) The electronic device according to (12), wherein the displacement sensor comprises at least one of a photosensor, a temperature sensor, and a pressure sensor.

(16) The electronic device according to (12), comprising one of an e-book, a newspaper, and an electronic tablet.

(17) A method of controlling a display unit comprising a display section, an A/D conversion section, a storage section, and a determination section, and a control section, the method comprising:
detecting a deflection amount of the display section;
converting the deflection amount into a digital value in the A/D conversation section;
storing a set value and the digital value in the storage section;
determining a non-visible portion of the display section based on the set value and the digital value; and
controlling display contents the display section.

(18) The method according to (17), wherein the controlling comprises preventing an image display on the non-visible portion of the display section.

(19) The method according to (17), wherein the controlling comprises displaying a fixed image on the non-visible portion of the display section.

(20) The method according to (17), wherein the controlling comprises displaying a pre-set moving image on the non-visible portion of the display section.

(21) A display unit, including:
a display section having flexibility;
a detection section that detects a deflection amount and a deflection direction of the display section;
a determination section that determines a visible face and a non-visible face of the display section based on a result of the detection of the detection section; and
a control section that controls display contents of the display section based on a result of the determination of the determination section.

(22) The display unit according to (21), wherein the control section controls display contents of the non-visible face of the display section.

(23) The display unit according to (21), wherein the control section stops a display function of the non-visible face.

(24) The display unit according to (21), wherein the control section switches display contents of the non-visible face to one of a fixed image and a moving image.

(25) The display unit according to (24), wherein the fixed image is changed at a constant time interval.

(26) The display unit according to any one of (21) to (25), wherein the determination section assumes that a substantially upper face direction of the display section corresponds to the visible face at the time of the determination.

(27) The display unit according to any one of (21) to (26), wherein the detection section includes an acceleration sensor that detects the deflection amount and the deflection direction of the display section.

(28) The display unit according to any one of (21) to (26), wherein the detection section includes a bend sensor that detects the deflection amount and the deflection direction of the display section.

(29) The display unit according to (27), wherein the acceleration sensor detects a display direction of the display section with respect to gravity.

(30) The display unit according to any one of (21) to (26), wherein the detection section includes a pressure sensor that obtains the deflection amount and the deflection direction based on a pressure spot detected on a front face and a rear face of the display section.

(31) The display unit according to any one of (21) to (26), wherein the detection section includes a temperature sensor that obtains the deflection amount and the deflection direction based on a heat spot detected on a front face and a rear face of the display section.

(32) The display unit according to any one of (21) to (26), wherein the detection section includes a photosensor that obtains the deflection amount and the deflection direction based on variation in a quantity of light on a front face and a rear face of the display section.

The present disclosure contains subject matter related to that disclosed in Japanese Priority Patent Application JP 2012-097625 filed in the Japan Patent Office on Apr. 23, 2012, the entire content of which is hereby incorporated by reference.

It should be understood by those skilled in the art that various modifications, combinations, sub-combinations and alterations may occur depending on design requirements and other factors insofar as they are within the scope of the appended claims or the equivalents thereof.

What is claimed is:

1. A display unit, comprising:
  a display panel that is flexible;
  a plurality of sensors configured to:
    detect a first direction of a first plane of the display panel; and
    detect a second direction of a second plane of the display panel; and
  control circuitry configured to:
    recognize a projection area of the display panel corresponding to the first plane of the display panel, based on a distance between at least two sensors of the plurality of sensors;
    control the projection area of the display panel in a first mode based on the detected first direction; and
    control the second plane of the display panel in a second mode based on the detected second direction, wherein
      the second mode is different from the first mode, and
      the second plane is controlled to execute one of:
        a display-stop function,
        a fixed image display function, or
        a screen-saver function.

2. The display unit according to claim 1, wherein
  the first plane is a visible portion for a user, and
  the second plane is a non-visible portion for the user.

3. The display unit according to claim 2, wherein the plurality of sensors is further configured to:
  determine the visible portion based on the detected first direction of the first plane; and
  determine the non-visible portion based on the detected second direction of the second plane.

4. The display unit according to claim 1, wherein the plurality of sensors comprises at least one of an acceleration sensor, a resistance sensor, a pressure sensor, a photosensor, or a temperature sensor.

5. The display unit according to claim 1, wherein a sensor of the plurality of sensors is a displacement sensor.

6. The display unit according to claim 1, wherein
  the control circuitry is further configured to change a first state of at least one of the first plane or the second plane to a second state based on at least one of the detected first direction of the first plane or the detected second direction of the second plane, and
  the first state is different from the second state.

7. The display unit according to claim 1, wherein
  the control circuitry is further configured to:
    display a visible image in the first mode; and
    stop the display of the visible image in the second mode, and
  the display panel includes organic electro luminescence (EL) pixels.

8. A display unit, comprising:
  a display panel that is flexible;
  a plurality of sensors configured to:
    detect a first plane of the display panel as a visible plane, based on a first direction of the first plane; and
    detect a second plane of the display panel as a non-visible plane, based on a second direction of the second plane; and
  control circuitry configured to:
    recognize a projection area of the display panel corresponding to the visible plane of the display panel, based on a distance between at least two sensors of the plurality of sensors;
    control the projection area in a first mode based on the first direction; and
    control the non-visible plane in a second mode based on the second direction, wherein
      the second mode is different from the first mode, and
      the non-visible plane is controlled to execute one of:
        a display stop function,
        a fixed image display function, or
        a screen-saver function.

9. The display unit according to claim 1, wherein the detected first direction is selectable by a user.

10. The display unit according to claim 1, wherein
  a sensor of the plurality of sensors is further configured to detect a contact area of a user's hand on the display panel, and
  the control circuitry is further configured to determine each of a visible portion of the display panel and a non-visible portion of the display panel based on the detected contact area.

* * * * *